US007429758B2

(12) United States Patent
Ruhnau et al.

(10) Patent No.: US 7,429,758 B2

(45) Date of Patent: Sep. 30, 2008

(54) OPTOELECTRONIC COMPONENT AND METHOD FOR PRODUCING IT

(75) Inventors: Marcus Ruhnau, Weiding (DE); Bert Braune, Wenzenbach (DE); Patrick Kromotis, Regensburg (DE); Georg Bogner, Lappersdorf (DE)

(73) Assignee: Osram Opto Semiconductor GmbH, Regensburg (DE)

( * ) Notice: Subject to any disclaimer, the term of this patent is extended or adjusted under 35 U.S.C. 154(b) by 253 days.

(21) Appl. No.: 11/141,721

(22) Filed: May 31, 2005

(65) Prior Publication Data

US 2005/0218531 A1 Oct. 6, 2005

Related U.S. Application Data

(63) Continuation of application No. 10/611,225, filed on Jun. 27, 2003, now Pat. No. 6,900,511.

(30) Foreign Application Priority Data

Jun. 28, 2002 (DE) ................................ 102 29 067

(51) Int. Cl.
*H01L 33/00* (2006.01)

(52) U.S. Cl. ................... 257/98; 257/E33.061; 257/95; 257/432; 257/678; 362/232; 362/240; 313/486

(58) Field of Classification Search .......... 257/E31.118, 257/E33.057, E33.072, E33.061, 432–434, 257/95, 98, 678, 788, 666; 362/232, 240; 313/486
See application file for complete search history.

(56) References Cited

U.S. PATENT DOCUMENTS 4,727,457 A * 2/1988 Thillays ...................... 362/582

(Continued)

FOREIGN PATENT DOCUMENTS

DE 195 36 454 A1 9/1995

(Continued)

OTHER PUBLICATIONS

Frank Mollmer et al., Siemens SMT-TOPLED LED's for Surface Mounting, Siemens Components 29 (1991), pp. 147-149.

(Continued)

*Primary Examiner*—Chris C. Chu
(74) *Attorney, Agent, or Firm*—Cohen Pontani Lieberman & Pavane LLP

(57) ABSTRACT

An optoelectronic component having a basic housing or frame (12) and at least one semiconductor chip (20), specifically a radiation-emitting or -receiving semiconductor chip, in a cavity (18) of the basic housing. In order to increase the efficiency of the optoelectronic component (10), reflectors are provided in the cavity in the region around the semiconductor chip. These reflectors are formed by virtue of the fact that a filling compound (28) filled at least partly into the cavity (18) is provided, the material and the quantity of the filling compound (28) being chosen in such a way that the filling compound, on account of the adhesion force between the filling compound and the basic housing, assumes a form which widens essentially conically from bottom to top in the cavity, and the conical inner areas (30) of the filling compound serve as reflector.

15 Claims, 1 Drawing Sheet

U.S. PATENT DOCUMENTS

| | | | | |
|---|---|---|---|---|
| 4,905,075 | A * | 2/1990 | Temple et al. | 257/680 |
| 5,875,205 | A * | 2/1999 | Spaeth et al. | 372/50.23 |
| 5,907,151 | A | 5/1999 | Gramann et al. | |
| 6,459,130 | B1 | 10/2002 | Arndt et al. | |
| 6,573,580 | B2 | 6/2003 | Arndt | |
| 6,605,828 | B1 * | 8/2003 | Schwarzrock et al. | 257/81 |
| 6,610,563 | B1 * | 8/2003 | Waitl et al. | 438/166 |
| 6,844,571 | B2 | 1/2005 | Krames et al. | |
| 6,900,511 | B2 * | 5/2005 | Ruhnau et al. | 257/432 |
| 2002/0057057 | A1 | 5/2002 | Sorg | |
| 2002/0070386 | A1 | 6/2002 | Krames et al. | |
| 2003/0002272 | A1 | 1/2003 | Suehiro et al. | |
| 2003/0038295 | A1 * | 2/2003 | Koda | 257/98 |
| 2003/0155624 | A1 | 8/2003 | Arndt | |

FOREIGN PATENT DOCUMENTS

| | | | |
|---|---|---|---|
| DE | 197 55 734 | A1 | 12/1997 |
| DE | 199 18 370 | A1 | 4/1999 |
| EP | 1 011 151 | A2 | 12/1999 |
| EP | 1 011 151 | | 6/2000 |
| JP | 60-63970 | | 4/1985 |
| JP | 60-063970 | | 4/1985 |
| JP | 10215001 | A * | 8/1998 |
| JP | 11-284234 | | 10/1999 |
| JP | 2001-223390 | | 8/2001 |
| JP | 2002-033517 | | 1/2002 |
| JP | 2002-33517 | | 1/2002 |
| JP | 2003142737 | A * | 5/2003 |

OTHER PUBLICATIONS

Office Action dated Nov. 21, 2006 issued for the counterpart German Application No. 102 29 067.9-33 by the German Patent Office.

Computer generated English Translation of JP 2002-033517 from the JPO Website.

* cited by examiner 10
18
22
32
121
30
20
30
28
26
12
28
14
14

10
18
22
20
32
30
120
121
30
26
12
28
26
28
14
14
$h_F$
16
241
16
24

OPTOELECTRONIC COMPONENT AND METHOD FOR PRODUCING IT

This is a U.S. Continuation application of Ser. No. 10/611,225 filed Jun. 27, 2003 now U.S. Pat. No. 6,900,511.

FIELD OF THE INVENTION

The present invention relates to an optoelectronic component, in particular a surface-mountable optoelectronic component, having at least one basic housing, which has a cavity, and at least one semiconductor chip, which is arranged in the cavity and emits and/or receives electromagnetic radiation, the cavity extending from a front side of the basic housing into the basic housing.

The present invention furthermore relates to a method for producing such an optoelectronic component.

BACKGROUND OF THE INVENTION

Conventionally, in the production of surface-mountable optoelectronic components, by way of example, firstly a prefabricated electrical leadframe is encapsulated by injection-moulding with a suitable plastics material which forms the basic housing of the component. This basic housing has a cavity (or else chip window) into which leadframe terminals are introduced from two opposite sides. A semiconductor chip that emits and/or transmits electromagnetic radiation, such as an LED chip, for example, is bonded and electrically contact-connected on one of the said leadframe terminals. A transparent or translucent potting compound is built into the cavity. This basic form of surface-mountable optoelectronic components is disclosed for example in the article "SIEMENS SMT-TOPLED für die Oberflächenmontage" ["SIEMENS SMT-TOPLED for surface mounting"] by F. Möllmer and G. Waitl, Siemens Components 29 (1991), issue 4, pages 147-149.

In the case of such optoelectronic components, it is customary, for the purpose of increasing the external efficiency, to form the cavity with oblique inner areas which serve as reflector. Depending on the angle of inclination of the inner areas, the opening of the cavity is correspondingly enlarged thereby.

Examples of optoelectronic components with such reflector arrangements are disclosed for example in the document DE 197 55 734 A1 and the document DE 199 18 370 A1.

A similar construction is described in the document DE 195 36 454 A1. In this case, a metal chip carrier part on which the semiconductor chip is mounted is provided in a cavity of a basic housing of the component. A well is formed in the chip carrier part in the region in which the semiconductor chip is fixed, the inner areas of which well approximately correspond to the form of an inverted truncated cone and form a reflector for the radiation emitted by the semiconductor chip.

Advancing miniaturization of optoelectronic components entails more and more often the requirement for the narrowest possible openings of the cavity and/or for more complex semiconductor chip and wiring arrangements in the cavity. In these cases, for lack of space, the side walls of the cavity can often only be formed perpendicularly or at a steep angle with respect to the bottom area of the cavity.

The usually Lambert or even rearwards directed radiation or reception characteristic of the semiconductor chip means, therefore, that significant losses of luminous flux arise and a lower external efficiency of the component thus arises. Therefore, there is a need for optoelectronic components which have a sufficiently good efficiency despite the absence of reflectors, or reflectors that cannot be realized, at the inner areas of their cavities.

SUMMARY OF THE INVENTION

One object of the present invention is to provide an optoelectronic component of the type mentioned in the introduction, and a method for producing it, which as far as possible meets the demand outlined above.

This and other objects are attained in accordance with one aspect of the invention directed to an optoelectronic component having at least one basic housing, which has a cavity, and at least one semiconductor chip, which is arranged in the cavity and emits and/or receives electromagnetic radiation. The cavity extends from a front side of the basic housing into the basic housing. A reflective filling compound is arranged in the cavity between the semiconductor chip and side walls of the cavity, of which filling compound at least one of its surfaces facing toward the front side of the basic housing is curved like a concave mirror, in particular concavely, as seen from the semiconductor chip, and forms a reflector area for part of the radiation.

Another aspect of the present invention is directed to a method for producing an optoelectronic component including formation of the basic housing with the cavity, positioning of the semiconductor chip in the cavity and filling of a filling compound into the cavity. The material and quantity of the filling compound are chosen in such a way that relative to a bottom area of the cavity, the filling height ($h_F$) thereof adjacent to the semiconductor chip is less than the distance between a laterally radiation-emitting and/or -receiving region of the semiconductor chip and the bottom area, and the surface thereof, as seen from the semiconductor chip, curves concavely in its course towards side walls of the cavity on account of the adhesion force between the material of the filling compound and the material of the side walls, and the surface is formed as a reflector for the radiation in this way.

The optoelectronic component according to the invention has a basic housing and at least one radiation-emitting and/or -receiving semiconductor chip in a cavity of the basic housing. Unlike in conventional optoelectronic components, the reflector is at least not solely realized by reflective side areas of the cavity of the basic housing itself, but rather is realized at least in part by a reflective filling compound filled into the cavity. For this purpose, the material and the quantity of the filling compound are preferably chosen in such a way that, during and/or after the filling process, on account of the adhesion force between the material of the filling compound and the material of the side areas of the cavity, the filling compound is drawn up at these side areas and forms a surface which is like a concave mirror, in particular is shaped like a parabola. This surface of the filling compound facing towards the front side of the housing serves as reflector area for electromagnetic radiation emitting and/or received by the semiconductor chip. The composition of the filling compound is selected, moreover, such that a highest possible proportion of the radiation is subjected to total reflection at the reflector area. This can be achieved by using materials with suitable refractive indices for the filling compound.

In other words, the cavity is partly filled with the filling compound and, on account of the adhesion force between filling compound and basic housing, an inner area of the filling compound which is essentially like a concave mirror, in particular concave[1]), from the point of view of the semiconductor chip is automatically established in the cavity since the filling compound creeps upwards at the lateral inner areas of the cavity of the basic housing. The concave-mirror-like inner areas of the filling compound that are thus formed form the reflector for the semiconductor chip inserted into the cavity. (1) note: here and below—in contrast to the priority application (wherein "convex" is used)—the form of the inner area is referred to as concave as seen from the chip; as a precaution, it shall already be expressly pointed out at this juncture that the term "concave" used in the present case relates to the same inner area configuration referred to as "convex" in the priority application. This is already revealed unambiguously in the priority application simply from the fact that, as expressly described in the priority application, the form of the inner area is formed for example by the filling compound creeping upwards at the lateral inner areas of the cavity of the basic housing, and by the filling compound having a parabola-like inner area.)

These reflector areas can be produced in a simple manner, even with very small openings of the cavities, by means of suitable apportioning of the filling compound in the cavity. Moreover, the terminals, wirings and the like which are present in the cavity are enclosed by the filling compound without any impairment of their functioning.

Consequently, with the measure according to the invention, even with optoelectronic components with narrow openings of the cavity and/or complex semiconductor chip and wiring arrangements in the cavity, it is possible to provide reflectors within the cavity and thus to increase the external efficiency of the components.

In a preferred embodiment of the invention, the material of the filling compound contains titanium oxide ($TiO_2$). In particular, the material of the filling compound is preferably an epoxy resin filled with $TiO_2$ particles. Particularly preferably, a proportion of $TiO_2$ in the filling compound (28) is between about 10 and 50% by volume.

In a manner similar to that in the case of conventional optoelectronic components, preferably a free surface of the chip remaining after mounting of the chip in the cavity and connection of the chip to external electrical terminals by means of a bonding wire, for example, and filling-in of the filling compound is covered with a radiation-transmissive, in particular transparent, encapsulation compound which encloses the semiconductor chip and preferably fills the cavity to the greatest possible extent.

An advantageous embodiment of the method according to the invention for producing an optoelectronic component having a basic housing and at least one semiconductor chip in a cavity of the basic housing comprises the following method steps:

(a) formation of a basic housing around a leadframe, the basic housing having a cavity into which terminals of the leadframe are introduced;

(b) positioning and electrical contact-connection of at least one radiation-emitting or -receiving semiconductor chip into the cavity; and (c) partial filling of a filling compound into the cavity, the material and the quantity of the filing compound being chosen in such a way that the filling compound, on account of the adhesion force between the filling compound and the basic housing, assumes a form which widens essentially conically from bottom to top in the cavity, and the conical inner areas of the filling compound serve as reflector.

Preferably, afterwards in a further method step (d), a radiation-transmissive, in particular transparent, encapsulation compound is filled into the cavity in order to completely enclose the semiconductor chip in the cavity.

The reflectivity of an epoxy-resin-based filling compound containing a $TiO_2$ proportion is up to about 80%. In a comparison between optoelectronic components of identical design but with differently embodied filling compounds according to the invention or no filling compound according to the invention in the cavity, but rather exclusively with a transparent encapsulation compound for the semiconductor chip, it was possible to obtain an increase in the external efficiency by up to 20% or more based on the filling compound according to the invention.

Further advantages and advantageous developments of the optoelectronic component according to the invention and of the method for producing it emerge from the exemplary embodiments described below in conjunction with FIGS. 1 and 2.

DETAILED DESCRIPTION OF THE DRAWINGS

In the two exemplary embodiments, identical or identically acting constituent parts are provided with the same reference symbols in each case.

Figure 1:
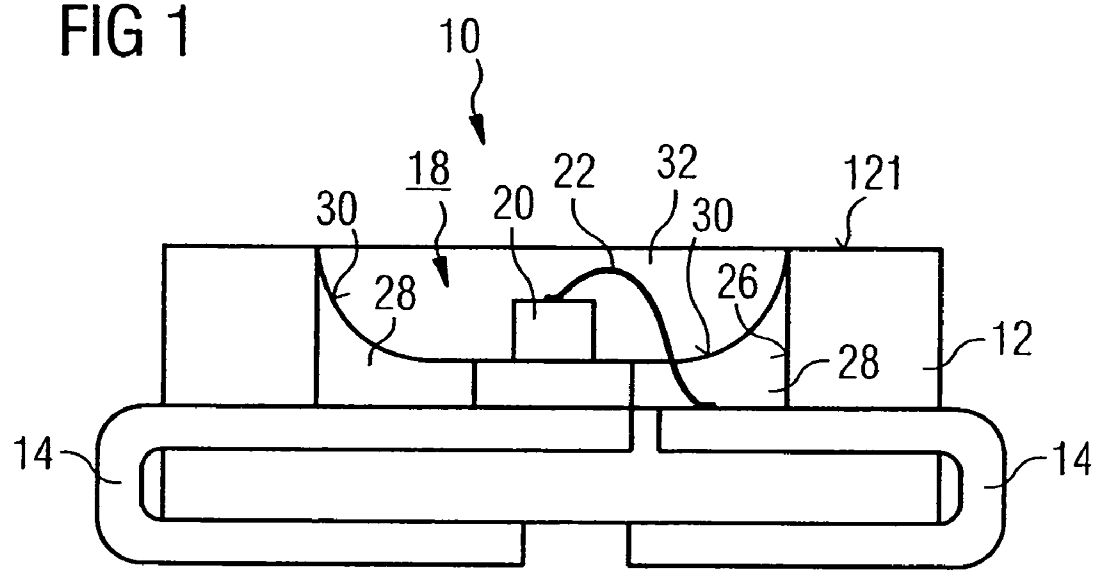
FIG. 1 shows a diagrammatic illustration of a sectional view of the first exemplary embodiment.

In the optoelectronic component 10 in accordance with FIG. 1, a basic housing 12 with cavity 18 is formed by encapsulating a leadframe 14 with a suitable plastics material by injection-moulding.

In the cavity 18, there is situated on the leadframe 14 a semiconductor chip 20 which emits and/or receives electromagnetic radiation, for example a light-emitting diode chip, which emits and/or receives at least part of the radiation via its side edges. The semiconductor chip 20 is connected to an electrical terminal of the leadframe 14 by means of a bonding wire 22. A reflective filling compound 28 is filled in between the semiconductor chip 20 and the side walls 26 of the cavity 18, the said filling compound comprising, for example, epoxy resin filled with $TiO_2$ particles, the proportion of $TiO_2$ in the filling compound 28 sufficing to significantly increase the reflectivity of the filling compound 28. The proportion of $TiO_2$ in the filling compound 28 preferably lies between about 10 and 50% by volume. Particles made of zirconium oxide, zinc oxide, barium sulphate, gallium nitride or a mixture of at least two of these types of particles are preferably suitable for use with an epoxy resin in the filling compound 28. It is important that the difference in refractive index between the epoxy resin and the particles is large enough such that the reflectivity of the filling compound 28 is increased.

The surface 30 of the filling compound, which faces towards the front side 121 of the basic housing 12, is curved concavely as seen from the semiconductor chip 20 and forms a reflector area at least for part of the laterally emitted and/or received radiation. Given corresponding geometry of the component 10 or the radiation characteristic of the semiconductor chip 20, a reflector area which is convex as seen from the semiconductor chip is conceivable as an alternative.

In addition to the semiconductor chip 20, a chip carrier substrate 24 (not illustrated in the figure) may be arranged between the said semiconductor chip and the basic housing 12, the dimensions of which chip carrier substrate are chosen in such a way that a trench is formed between its side edges 241 and the side walls 26 of the cavity 18, the filling compound 28 being situated in the said trench.

Relative to the bottom area of the cavity 18, the filing height $h_F$ of the filling compound 28 adjacent to the semiconductor chip 20 is less than the distance between the region of the relevant laterally emitting and/or receiving region of the semiconductor chip 20 and the bottom area. The filling height $h_F$ rises beyond the abovementioned distance in its course towards the side wall 26 of the cavity 18.

That free surface region of the semiconductor chip 20 which lies above the filling compound is covered by a radiation-transmissive encapsulation compound 32 and comprises an epoxy resin again, for example, or another suitable reaction resin.

Figure 2:
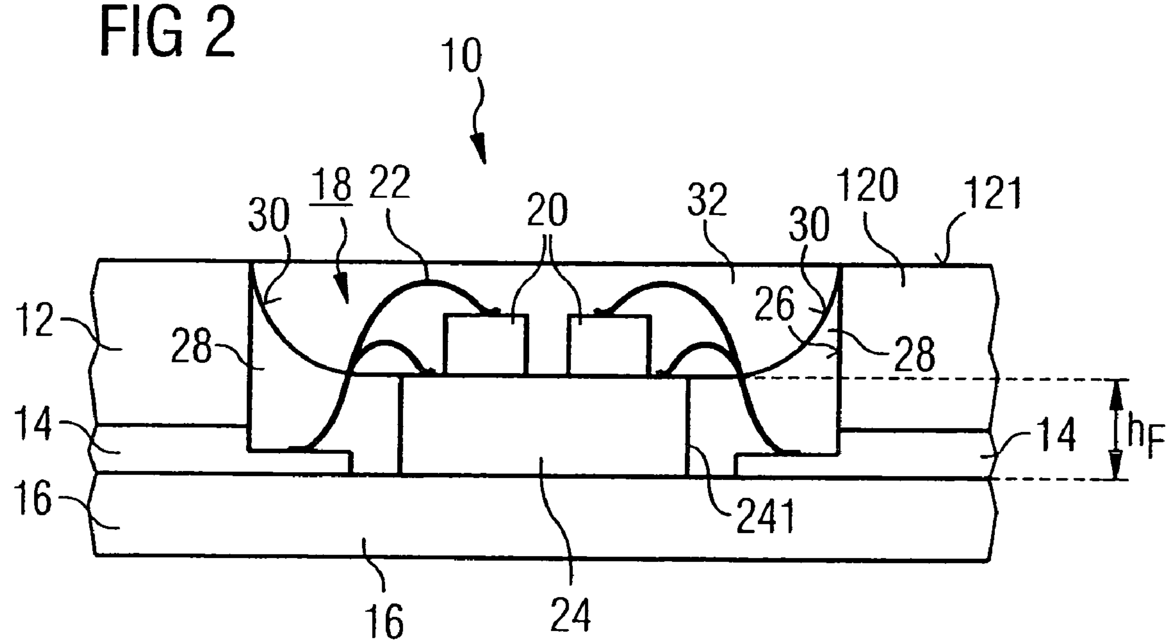
FIG. 2 shows a diagrammatic illustration of a sectional view of the second exemplary embodiment.

In the exemplary embodiment in accordance with FIG. 2 external electrical terminals 14 are applied on a carrier body 16 comprising aluminium, for example. The cavity 18 is realized by means of a plastic housing frame 120, which is likewise arranged on the carrier body 16.

In the cavity, two semiconductor chips 20 which emit and/or receive electromagnetic radiation, for example two light-emitting diode (LED) chips, are mounted on a chip carrier substrate 24 comprising silicon, for example. The two LED chips are electrically conductively connected to the electrical terminals 14 via bonding wires 22.

As is clearly discernible in the sectional view of FIG. 2, in the same way as in the exemplary embodiment described first, the inner areas 26 of the cavity 18 are virtually cylindrical, in other words they run very steeply from the bottom area to the front side of the basic housing 12. These steep side walls 26 have only a negligibly small reflector effect.

Given a uniform bottom area in the cavity, whose minimum size is fixedly predetermined by the size and number of the chips and/or the space requirement for chip mounting and contact-connection, a reduction of the steepness of the side walls 26 of the cavity would entail an enlargement of the component. This must be avoided in any case on account of the lack of space in many applications. This aim is achieved by means of the invention.

In the exemplary embodiment in accordance with FIG. 2, the cavity 18 is filled with a filling compound 28 in the region of the trench between the chip carrier substrate 24 and the side walls 26 of the cavity 18, the said filling compound for example comprising the same material as the filling compound 28 of the first exemplary embodiment.

As is clearly discernible in the sectional view of FIG. 2, the filling height $h_F$ of the filling compound 28 adjacent to the semiconductor chips 20, i.e. adjacent to the chip carrier substrate 24, is significantly smaller than adjacent to the side walls 26 of the cavity 18, where the filling compound 28 is drawn up essentially as far as the edge with the front side 121 of the basic housing 12. In this way, the surface of the filling compound 28 acquires a form opening essentially like a parabola towards the front side. Given a suitable choice of the material and the apportioning of the filling compound 28, this form results automatically on account of the adhesion forces between the filling compound 28 and the material of the housing frame 120. The concavely curved inner areas 30 of the filling compound 28 as seen from the semiconductor chips 20 serve as reflector for the radiation which is emitted and/or received laterally by the semiconductor chips 20.

The reflectivity of the filling compound 28 containing the $TiO_2$ proportion is up to about 80%. In comparison with an optoelectronic component in which the cavity is exclusively filled with a transparent filling compound, with the optoelectronic component 10 of the present invention it was thus possible to increase the external efficiency by up to 20% or more.

In order to protect the semiconductor chips 20, the cavity 18 is completely filled with a radiation-transmissive, for example transparent, encapsulation compound 32 which encloses the semiconductor chips 20 and is transmissive for the radiation to be emitted or to be received by the semiconductor chips 20. For this encapsulation compound 32, it is possible to use, as in the conventional components, suitable filling compounds comprising transparent synthetic resins, such as epoxy resin, for example, or comprising polycarbonate, which is preferably especially coordinated with the properties of the filling compound 28 (also applies to exemplary embodiment in accordance with FIG. 1).

It goes without saying that, in both exemplary embodiments, the number of semiconductor chips 20 in the cavity 18 of the basic housing 12 is not restricted to one or two; rather, it is also possible for more than two semiconductor chips to be mounted in the cavity. In addition, it is also possible for more than just one cavity 18 to be formed in a basic housing 12.

In order to produce an optoelectronic component 10 in accordance with the first or second exemplary embodiment, firstly the basic housing 12 with the cavity 18 is formed and then the semiconductor chip 20 is mounted in the cavity 18 and electrically conductively connected to the external electrical terminals 14. The filling compound 28 is subsequently inserted into the cavity 18. This is done by apportioning such that (i) relative to a bottom area of the cavity 18, the filling height $h_F$ of the filling compound adjacent to the semiconductor chip 20 is less than the distance between the laterally radiation-emitting and/or -receiving region of the semiconductor chip 20 and the said bottom area, and (ii) the surface of the filling compound, as seen from the semiconductor chip 20, is curved concavely in its course towards the side walls 26 of the cavity 18 on account of the adhesion force between the material of the filling compound 28 and the material of the side walls 26, consequently the filling compound creeps upwards at the side walls 26.

A surface 30 serving as reflector for the radiation is formed in this way.

The radiation-transmissive encapsulation compound 32 is subsequently filled into the cavity 18, which covers at least those surfaces of the semiconductor chip (20) which are still uncovered after the preceding steps.

It goes without saying that the above description of the invention on the basis of the exemplary embodiments is not to be understood as a restriction of the invention thereto. Rather, the concept of the invention set forth in claims 1 and 12 can be employed in a multiplicity of widely different designs.

We claim:

1. An optoelectronic component comprising:

a basic housing, which has a cavity;

a semiconductor chip, which is arranged in the cavity and emits and/or receives electromagnetic radiation, the cavity extending from a front side of the basic housing into the basic housing; and a reflective filling compound comprising a resin filled with particles, the reflective filling compound being arranged in the cavity between the semiconductor chip and side walls of the cavity, of which reflective filling compound at least one of its surfaces facing toward the front side of the basic housing is curved and forms a reflector area for part of the radiation.

2. The optoelectronic component according to claim 1, further comprising a chip carrier substrate arranged between the semiconductor chip and the basic housing, the dimensions of which chip carrier substrate are chosen in such a way that a trench is formed between its side edges and the side walls of the cavity, the filling compound being situated in the trench.

3. The optoelectronic component according to claim 1, wherein relative to a bottom area of the cavity, the filling height ($h_F$) of the reflective filling compound adjacent to the semiconductor chip is less than the distance between the region of the relevant laterally emitting and/or receiving region of the semiconductor chip and the bottom area and the filling height ($h_F$) rises beyond this distance in its course towards the side wall of the cavity.

4. The optoelectronic component according to claim 1, wherein the particles are made of a material having a refractive index which is higher than a refractive index of the resin.

5. The optoelectronic component according to claim 4, wherein the resin is epoxy resin and the particles have a refractive index which is higher than the refractive index of the epoxy resin.

6. The optoelectronic component according to claim 4, wherein the particles contain at least one material selected from the group consisting of $TiO_2$, zirconium dioxide, zinc oxide, barium sulphate, gallium nitride particles and/or a combination of such particles.

7. The optoelectronic component according to claim 6, wherein a proportion by volume of $TiO_2$ particles in the reflective filling compound is between 10 and 50% by volume.

8. The optoelectronic component according to claim 4, wherein a proportion by volume of the particles in the resin is chosen so that a reflectivity of the filling compound is increased.

9. The optoelectronic component according to claim 1, further comprising a radiation-transmissive encapsulation compound which at least partly encapsulates the semiconductor chip.

10. The optoelectronic component according to claim 9, wherein the reflector area forms a reflecting interface between the reflective filling compound and the radiation-transmissive encapsulation compound.

11. The optoelectronic component according to claim 1, wherein the basic housing has a carrier body, on which there are arranged a housing frame, which forms the cavity, and at least one external electrical connection, reaching into the cavity, for the semiconductor chip.

12. The optoelectronic component according to claim 11, further comprising a chip carrier substrate arranged between the semiconductor chip and the basic housing, the dimensions of which chip carrier substrate are chosen in such a way that a trench is formed between its side edges and the side walls of the cavity, the filling compound being situated in the trench, wherein the carrier body and the chip carrier substrate are produced from materials having good thermal conductivity.

13. The optoelectronic component according to claim 12, wherein the carrier body essentially has metallic material.

14. The optoelectronic component according to claim 12, wherein the chip carrier substrate essentially has silicon.

15. The optoelectronic component according to claim 1, wherein a portion of the radiation is subjected to total reflection at the reflector area.

* * * * *